(12) United States Patent
Ku et al.

(10) Patent No.: US 10,985,758 B2
(45) Date of Patent: Apr. 20, 2021

(54) RANDOM CODE GENERATOR WITH FLOATING GATE TRANSISTOR TYPE MEMORY CELL

(71) Applicant: eMemory Technology Inc., Hsin-Chu (TW)

(72) Inventors: Wei-Ming Ku, Hsinchu County (TW); Wein-Town Sun, Hsinchu County (TW); Ying-Je Chen, Hsinchu County (TW)

(73) Assignee: EMEMORY TECHNOLOGY INC., Hsin-Chu (TW)

(*) Notice: Subject to any disclaimer, the term of this patent is extended or adjusted under 35 U.S.C. 154(b) by 0 days.

(21) Appl. No.: 16/844,265

(22) Filed: Apr. 9, 2020

(65) Prior Publication Data

US 2020/0327946 A1 Oct. 15, 2020

Related U.S. Application Data

(60) Provisional application No. 62/832,853, filed on Apr. 11, 2019.

(51) Int. Cl.
*G11C 16/26* (2006.01)
*G11C 16/24* (2006.01)
(Continued)

(52) U.S. Cl.
CPC ......... *H03K 19/0013* (2013.01); *G05F 3/262* (2013.01); *G11C 5/025* (2013.01); *G11C 7/06* (2013.01); *G11C 7/1051* (2013.01); *G11C 7/1084* (2013.01); *G11C 11/1673* (2013.01); *G11C 11/1675* (2013.01); *G11C 11/1697* (2013.01); *G11C 16/08* (2013.01); *G11C 16/14* (2013.01); *G11C 16/16* (2013.01); *G11C 16/24* (2013.01); *G11C 16/26* (2013.01);
(Continued)

(58) Field of Classification Search
CPC ......... G11C 16/16; G11C 7/06; G11C 7/1051; G11C 7/1084; G11C 16/08; G11C 16/14; G11C 16/24; G11C 16/26; G11C 5/025; G11C 11/1673; G11C 11/1675; G11C 11/1697; G11C 11/1659; G11C 11/161; G11C 11/165
See application file for complete search history.

(56) References Cited

U.S. PATENT DOCUMENTS 7,209,392 B2  4/2007 Chen et al.
8,941,167 B2  1/2015 Chen et al.
(Continued)

*Primary Examiner* — Gene N Auduong
(74) *Attorney, Agent, or Firm* — WPAT, PC

(57) ABSTRACT

A random code generator includes a memory cell, two write buffers and two sensing circuits. The memory cell includes a first program path between a first source line and a first bit line, a second program path between the first source line and a second bit line, a first read path between a second source line and a third bit line, and a second read path between a third source line and a fourth bit line. The two write buffers are connected with the first bit line and the second bit line, respectively. The two sensing circuits are connected with the third bit line and the fourth bit line, respectively. The two sensing circuits generate a first output signal and the second output signal to the corresponding write buffers according to the read currents in the corresponding read paths.

19 Claims, 6 Drawing Sheets

(51) Int. Cl.

| | | |
|---|---|---|
| *G11C 16/08* | (2006.01) | |
| *G11C 16/14* | (2006.01) | |
| *G11C 7/06* | (2006.01) | |
| *G11C 7/10* | (2006.01) | |
| *H03K 19/00* | (2006.01) | |
| *H03K 17/16* | (2006.01) | |
| *H03K 19/0185* | (2006.01) | |
| *H03K 3/356* | (2006.01) | |
| *H03K 19/0944* | (2006.01) | |
| *G05F 3/26* | (2006.01) | |
| *H02M 3/07* | (2006.01) | |
| *H03K 17/687* | (2006.01) | |
| *G11C 5/02* | (2006.01) | |
| *G11C 11/16* | (2006.01) | |
| *G11C 16/16* | (2006.01) | |

(52) U.S. Cl.
CPC .............. *H02M 3/07* (2013.01); *H03K 3/356* (2013.01); *H03K 17/162* (2013.01); *H03K 17/6871* (2013.01); *H03K 19/018528* (2013.01); *H03K 19/0944* (2013.01); *G05F 3/267* (2013.01)

(56) References Cited

U.S. PATENT DOCUMENTS

| | | | |
|---|---|---|---|
| 9,613,714 B1 | 4/2017 | Wong et al. | |
| 10,693,461 B1 * | 6/2020 | Chang | G11C 11/1659 |
| 2014/0340122 A1 * | 11/2014 | Savanth | H02M 3/157 |
| | | | 327/50 |
| 2015/0171858 A1 * | 6/2015 | Matsuoka | H03K 3/35613 |
| | | | 327/109 |

* cited by examiner

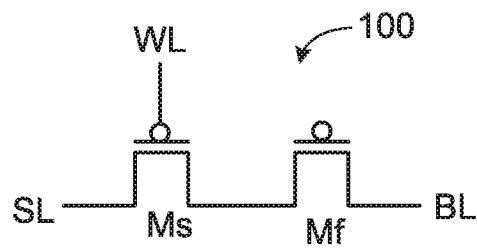
FIG. 1A
(PRIOR ART)
FIG. 1B
(PRIOR ART)
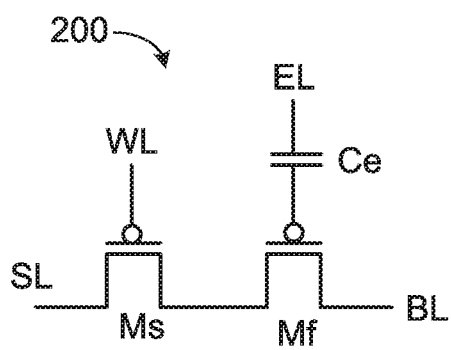
FIG. 2A
(PRIOR ART)
FIG. 2B
(PRIOR ART)

RANDOM CODE GENERATOR WITH FLOATING GATE TRANSISTOR TYPE MEMORY CELL

This application claims the benefit of U.S. provisional application Ser. No. 62/832,853, filed Apr. 11, 2019, the subject matter of which is incorporated herein by reference.

FIELD OF THE INVENTION

The present invention relates to a random code generator, and more particularly to a random code generator with a floating gate transistor type memory cell.

BACKGROUND OF THE INVENTION

Generally, the non-volatile memories are divided into a one-time programmable memory (also referred as an OTP memory) and a multi-time programmable memory (also referred as MTP memory). The OTP memory comprises plural OTP memory cells. The MTP memory comprises plural MTP memory cells. Moreover, the OTP memory cell or the MTP memory cell with a floating gate transistor has been provided.

For example, an OTP memory cell and a MTP memory cell with floating gate transistors are disclosed in U.S. Pat. No. 8,941,167. FIG. 1A is a schematic circuit diagram illustrating an OTP memory cell with a floating gate transistor. FIG. 1B schematically illustrates bias voltages for performing associated operations on the OTP memory cell as shown in FIG. 1A.

As shown in FIG. 1A, the OTP memory cell 100 comprises a select transistor Ms and a floating gate transistor Mf. A first terminal of the select transistor Ms is connected with a source line SL. A control terminal of the select transistor Ms is connected with a word line WL. A first terminal of the floating gate transistor Mf is connected with a second terminal of the select transistor Ms. A second terminal of the floating gate transistor Mf is connected with a bit line BL. A program path and a read path are connected between the source line SL and the bit line BL. By providing proper bias voltages to the word line WL, the source line SL and the bit line BL, a program operation or a read operation is selectively performed on the floating gate transistor Mf of the OTP memory cell 100.

Please refer to FIG. 1B. For performing the program operation (PGM), a program voltage Vpp is provided to the source line SL, and a ground voltage (0V) is provided to the word line WL and the bit line BL. For example, the program voltage Vpp is 8V.

When the select transistor Ms is turned on, the program path between the source line SL and the bit line BL generates a program current. Moreover, electrons are injected into the floating gate of the floating gate transistor Mf through a channel region of the floating gate transistor Mf. Consequently, the program operation is completed.

For performing a read operation (READ), a read voltage Vr is provided to the source line SL, and the ground voltage (0V) is provided to the word line WL and the bit line BL. For example, the read voltage Vr is 3.0V.

When the select transistor Ms is turned on, the read path between the source line SL and the bit line BL generates a read current. The magnitude of the read current is dependent on the amount of electrons stored in the floating gate of the floating gate transistor Mf. For example, if no electrons are stored in the floating gate, the read current is very low (e.g., nearly zero). Whereas, if electrons are stored in the floating gate, the read current is higher. According to the magnitude of the read current flowing through the bit line BL, the storage state of the OTP memory cell 100 is determined.

For example, a sense amplifier (not shown) is connected with the bit line BL to receive the read current. Moreover, the sense amplifier further receives a reference current. If the magnitude of the read current is lower than the reference current, the sense amplifier judges that the floating gate transistor Mf of the OTP memory cell 100 is in the first storage state. Whereas, if the magnitude of the read current is higher than the reference current, the sense amplifier judges that the floating gate transistor Mf of the OTP memory cell 100 is in the second storage state.

FIG. 2A is a schematic circuit diagram illustrating a MTP memory cell with a floating gate transistor. FIG. 2B schematically illustrates bias voltages for performing associated operations on the MTP memory cell as shown in FIG. 2A.

As shown in FIG. 2A, the MTP memory cell 200 comprises a select transistor Ms, a floating gate transistor Mf and a capacitor Ce. A first terminal of the select transistor Ms is connected with a source line SL. A control terminal of the select transistor Ms is connected with a word line WL. A first terminal of the floating gate transistor Mf is connected with a second terminal of the select transistor Ms. A second terminal of the floating gate transistor Mf is connected with a bit line BL. The capacitor Ce is connected between a floating gate of the floating gate transistor Mf and an erase line EL. A program path and a read path are connected between the source line SL and the bit line BL. An erase path is connected between the floating gate and the erase line EL.

Please refer to FIG. 2B. For performing the program operation (PGM), a program voltage Vpp is provided to the source line SL, and a ground voltage (0V) is provided to the word line WL, the bit line BL and the erase line EL. For example, the program voltage Vpp is 8V.

When the select transistor Ms is turned on, the program path between the source line SL and the bit line BL generates a program current. Moreover, electrons are injected into the floating gate of the floating gate transistor Mf through a channel region of the floating gate transistor Mf. Consequently, the program operation is completed.

For performing a read operation (READ), a read voltage Vr is provided to the source line SL, and the ground voltage (0V) is provided to the word line WL and the bit line BL. For example, the read voltage Vr is 3.0V When the select transistor Ms is turned on, the read path between the source line SL and the bit line BL generates a read current. The magnitude of the read current and the storage state of the MTP memory cell 200 are dependent on the amount of electrons stored in the floating gate of the floating gate transistor Mf. Similarly, a sense amplifier (not shown) is connected with the bit line BL to receive the read current. According to the magnitude of the read current, the sense amplifier judges whether the floating gate transistor Mf of the floating gate transistor Mf is in a first storage state or a second storage state.

For performing an erase operation (ERS), the ground voltage (0V) is provided to the source line SL, the word line WL and the bit line BL, and an erase voltage Vee is provided to the erase line EL. For example, the erase voltage Vee is 12.0V.

Meanwhile, the electrons stored in the floating gate are ejected to the erase line EL through the erase line EL. That is, the electrons stored in the floating gate are ejected to the erase line EL through the capacitor Ce and departed from the floating gate transistor Mf.

A physically unclonable function (PUF) technology is a novel method for protecting the data of a semiconductor chip. That is, the use of the PUF technology can prevent the data of the semiconductor chip from being stolen. In accordance with the PUF technology, the semiconductor chip is capable of providing a random code. This random code is used as a unique identity code (ID code) of the semiconductor chip to achieve the protecting function.

Generally, the PUF technology acquires the unique random code of the semiconductor chip according to the manufacturing variation of the semiconductor chip. This manufacturing variation includes the semiconductor process variation. That is, even if the PUF semiconductor chip is produced by a precise manufacturing process, the random code cannot be duplicated. Consequently, the PUF semiconductor chip is suitably used in the applications with high security requirements.

Moreover, U.S. Pat. No. 9,613,714 disclosed a random code generator with an antifuse transistor type memory cell. The storage state of the antifuse transistor type memory cell is used for a random code. The present invention provides a random code generator with another type memory cell.

SUMMARY OF THE INVENTION

An embodiment of the present invention provides a random code generator. The random code generator includes a memory cell, a first write buffer, a second write buffer, a first sensing circuit and a second sensing circuit. The memory cell includes a first program path, a second program path, a first read path and a second read path. The first program path is connected between a first source line and a first bit line. The second program path is connected between the first source line and a second bit line. The first read path is connected between a second source line and a third bit line. The second read path is connected between a third source line and a fourth bit line. The first write buffer is connected with the first bit line. The second write buffer is connected with the second bit line. The first sensing circuit is connected with the third bit line. The first sensing circuit generates a first output signal to the second write buffer according to a first read current in the first read path. The second sensing circuit is connected with the fourth bit line. The second sensing circuit generates a second output signal to the first write buffer according to a second read current in the second read path. While an enrolling operation is performed, the first program path and the second program path perform a program operation, and the first read path and the second read path perform a read operation. If the first output signal and the second output signal are different, one of the first program path and the second program path stop performing the program operation.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1A (prior art) is a schematic circuit diagram illustrating an OTP memory cell with a floating gate transistor;

FIG. 1B (prior art) schematically illustrates bias voltages for performing associated operations on the OTP memory cell as shown in FIG. 1A;

FIG. 2A (prior art) is a schematic circuit diagram illustrating a MTP memory cell with a floating gate transistor;

FIG. 2B (prior art) schematically illustrates bias voltages for performing associated operations on the MTP memory cell as shown in FIG. 2A;

DETAILED DESCRIPTION OF PREFERRED EMBODIMENTS

Figure 3A:
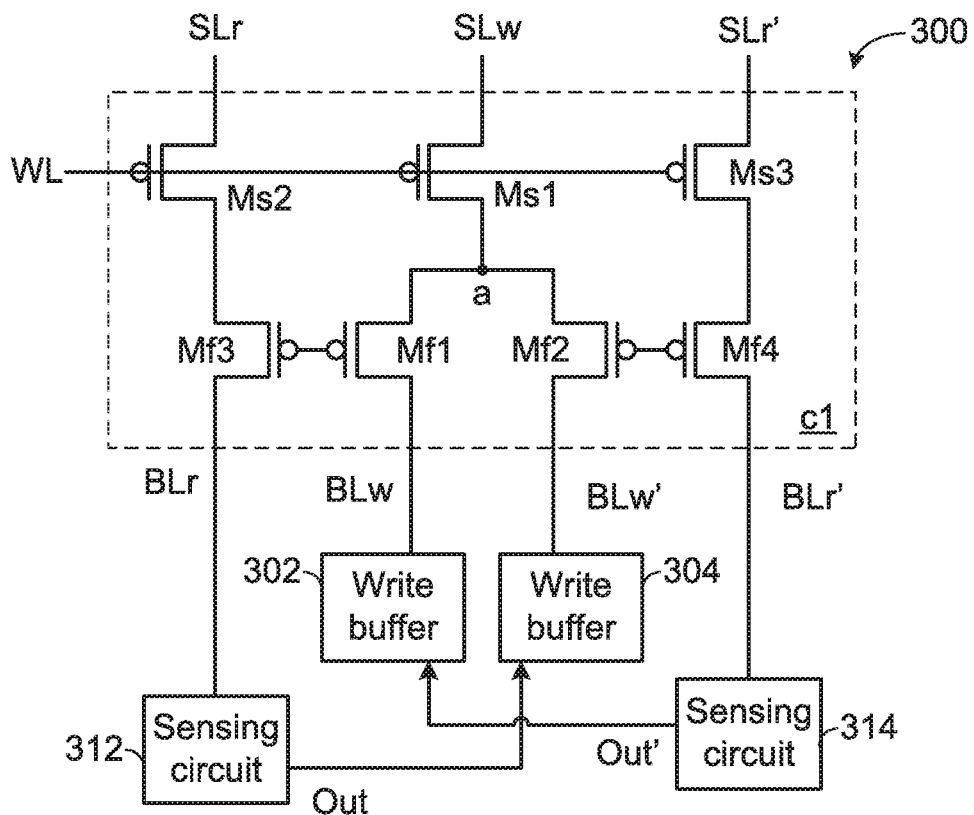
FIG. 3A is a schematic circuit diagram illustrating a random code generator according to a first embodiment of the present invention.

According to the characteristics of the floating gate transistor, the present invention provides a floating gate transistor type memory cell. The floating gate transistor type memory cell is used as a PUF memory cell and applied to a random code generator. FIG. 3A is a schematic circuit diagram illustrating a random code generator according to a first embodiment of the present invention. As shown in FIG. 3A, the random code generator 300 comprises a PUF memory cell c1, a first write buffer 302, a second write buffer 304, a first sensing circuit 312 and a second sensing circuit 314. For example, the first sensing circuit 312 and the second sensing circuit 314 are sense amplifiers.

In this embodiment, the PUF memory cell c1 comprises two program paths and two read paths. A first program path is connected between a source line SLw and a bit line BLw. A second program path is connected between the source line SLw and a bit line BLw'. A first read path is connected between a source line SLr and a bit line BLr. A second read path is connected between a source line SLr' and a bit line BLr'. Each of the first program path, the second program path, the first read path and the second read path comprises a floating gate transistor.

Please refer to FIG. 3A again. The first program path comprises a select transistor Ms1 and a floating gate transistor Mf1. A first terminal of the select transistor Ms1 is connected with the source line SLw. A control terminal of the select transistor Ms1 is connected with a word line WL. A second terminal of the select transistor Ms1 is connected with a node a. A first terminal of the floating gate transistor Mf1 is connected with the node a. A second terminal of the floating gate transistor Mf1 is connected with the bit line BLw.

The second program path comprises the select transistor Ms1 and a floating gate transistor Mf2. A first terminal of the floating gate transistor Mf2 is connected with the node a. A second terminal of the floating gate transistor Mf2 is connected with the bit line BLw'.

The first read path comprises a select transistor Ms2 and a floating gate transistor Mf3. A first terminal of the select transistor Ms2 is connected with the source line SLr. A control terminal of the select transistor Ms2 is connected with the word line WL. A first terminal of the floating gate transistor Mf3 is connected with a second terminal of the select transistor Ms2. A second terminal of the floating gate transistor Mf3 is connected with the bit line BLr. Moreover, the floating gate transistor Mf1 of the first program path and the floating gate transistor Mf3 of the first read path have the shared floating gate. That is, the floating gate of the floating gate transistor Mf1 and the floating gate of the floating gate transistor Mf3 are connected with each other.

The second read path comprises a select transistor Ms3 and a floating gate transistor Mf4. A first terminal of the select transistor Ms3 is connected with the source line SLr'. A control terminal of the select transistor Ms3 is connected with the word line WL. A first terminal of the floating gate transistor Mf4 is connected with a second terminal of the select transistor Ms3. A second terminal of the floating gate transistor Mf4 is connected with the bit line BLr'. Moreover, the floating gate transistor Mf2 of the second program path and the floating gate transistor Mf4 of the second read path have the shared floating gate. That is, the floating gate of the floating gate transistor Mf2 and the floating gate of the floating gate transistor Mf4 are connected with each other.

The first write buffer 302 is connected with the bit line BLw. The second write buffer 304 is connected with the bit line BLw'. The first sensing circuit 312 is connected with the bit line BLr. The second sensing circuit 314 is connected with the bit line BLr'.

While an enrolling operation of the random code generator 300 is performed, the first sensing circuit 312 issues an output signal OUT to the second write buffer 304 to disable the second write buffer 304. At the same time, the second sensing circuit 314 issues an output signal OUT' to the first write buffer 302 to disable the first write buffer 302.

Figure 3B:
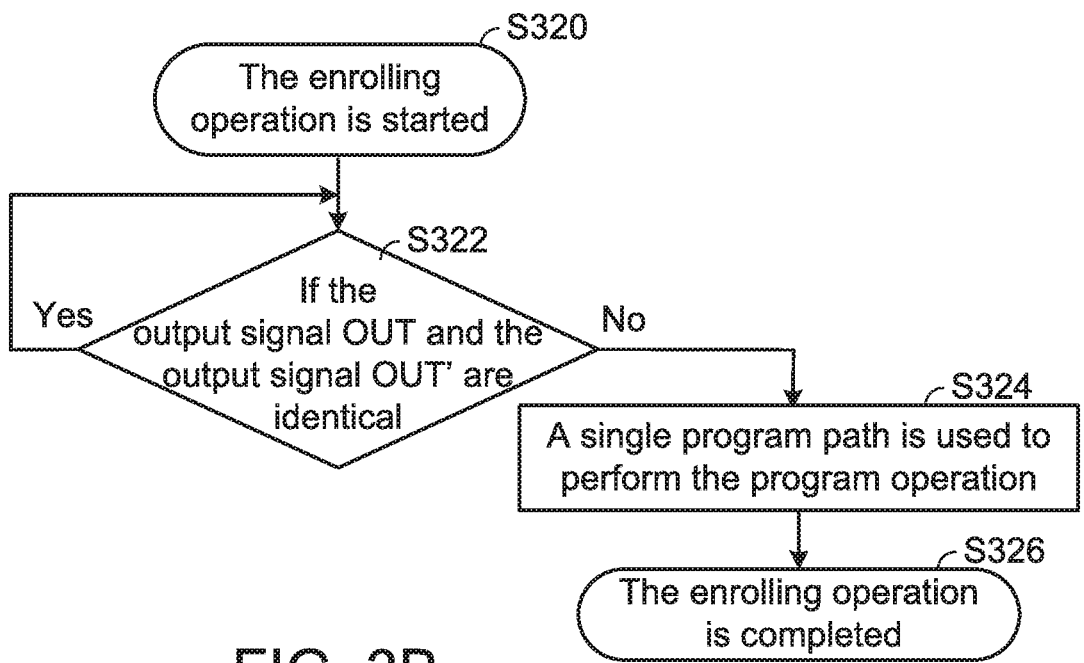
FIG. 3B is a flowchart illustrating an exemplary method of performing the enrolling operation of the random code generator according to the first embodiment of the present invention.

FIG. 3B is a flowchart illustrating an exemplary method of performing the enrolling operation of the random code generator according to the first embodiment of the present invention.

Firstly, the enrolling operation is started (Step S320). Meanwhile, the first program path and the second program path of the random code generator perform the program operation, and the first read path and the second read path perform the read operation.

Then, a step S322 is performed to judge whether the output signal OUT and the output signal OUT' are identical. If the judging condition of the step S322 is not satisfied, the random code generator 300 uses a single program path to perform the program operation (Step S324). That is, if the logic level state state of the output signal OUT and the output signal OUT' is changed, one of the first program path and the second program path of the random code generator 300 continuously performs the program operation. Meanwhile, the other program path stops the program operation. Then, the enrolling operation of the random code generator 300 is completed (Step S326). The process of performing the enrolling operation will be described in more details as follows.

Figure 4A:
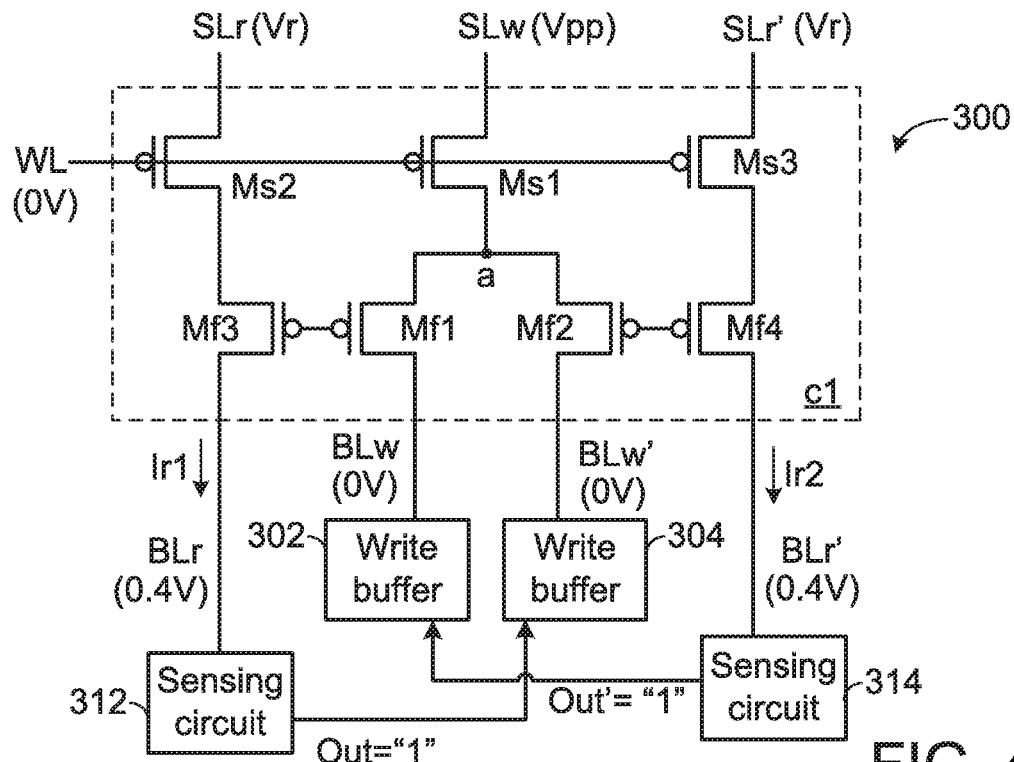
FIGS. 4A, 4B and 4C schematically illustrate a process of performing the enrolling operation of the random code generator according to the first embodiment of the present invention.
Figure 4B:
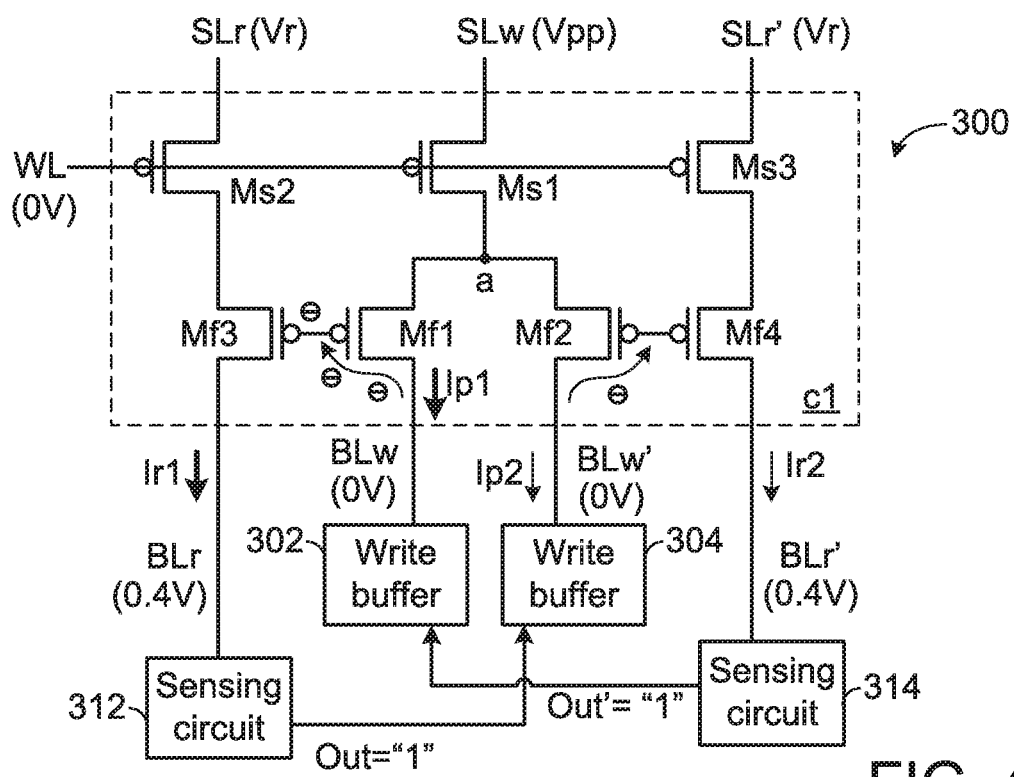
Figure 4C:
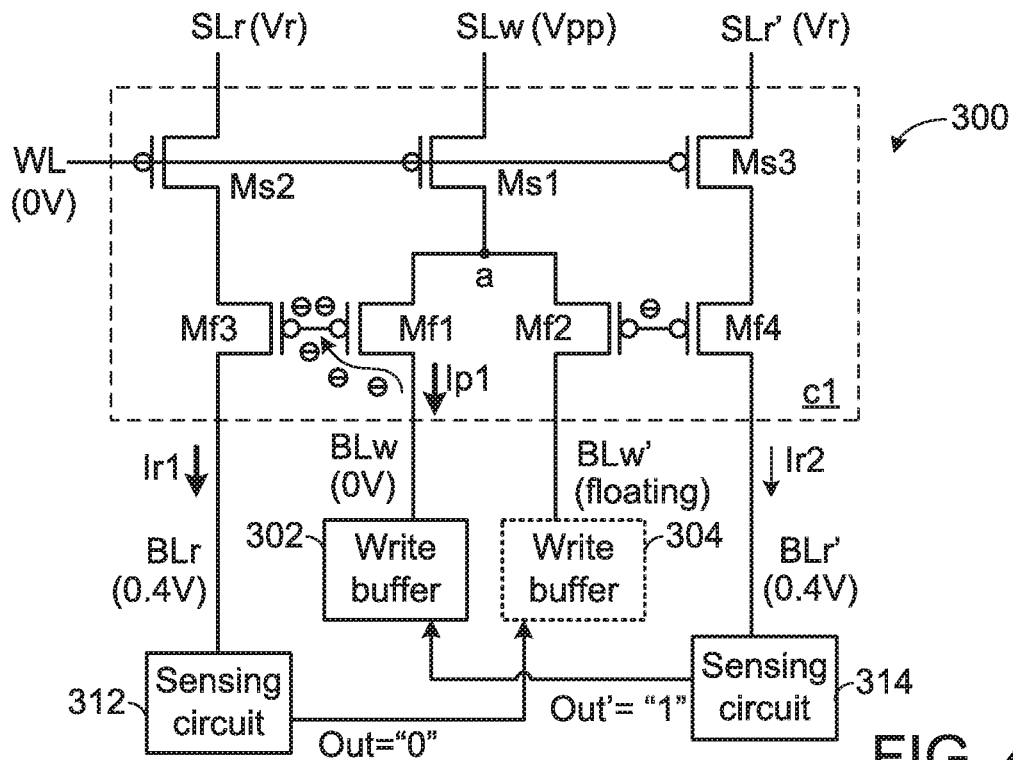

FIGS. 4A, 4B and 4C schematically illustrate a process of performing the enrolling operation of the random code generator according to the first embodiment of the present invention.

Please refer to FIG. 4A. For performing the enrolling operation, the ground voltage (0V) is provided to the world line WL, a program voltage Vpp is provided to the source line SLw, and a read voltage Vr is provided to the source line SLr and the source line SLr'. Moreover, the first write buffer 302 provides the ground voltage (0V) to the bit line BLw, the second write buffer 304 provides the ground voltage (0V) to the bit line BLw', the first sensing circuit 312 provides a first voltage (e.g., 0.4V) to the bit line BLr, and the second sensing circuit 314 provides the first voltage (e.g., 0.4V) to the bit line BLr'. In an embodiment, the program voltage Vpp is 7.25V, the read voltage Vr is 3.6V, and the first voltage is 0.4V. In another embodiment, the first voltage is equal to the ground voltage (0V). That is, the magnitude of the program voltage Vpp is higher than the magnitude of the read voltage Vr, the magnitude of the read voltage Vr is higher than the magnitude of the first voltage, and the magnitude of the first voltage is higher than or equal to the ground voltage (0V).

Meanwhile, the select transistors Ms1, Ms2 and Ms3 are turned on. Consequently, the enrolling operation on the PUF memory cell c1 is started. That is, the first program path and the second program path start to perform the program operation, and the first read path and the second read path start to perform the read operation.

In the initial stage of performing the enrolling operation on the PUF memory cell c1, no electrons are stored in the shared floating gate of the floating gate transistors Mf1 and Mf3. Consequently, the magnitude of a first read current Ir1 generated by the first read path is very low (e.g., nearly zero). Similarly, since no electrons are stored in the shared floating gate of the floating gate transistors Mf2 and Mf4, the magnitude of a second read current Ir2 generated by the second read path is very low (e.g., nearly zero). Under this circumstance, the reference current of the first sensing circuit 312 is higher than the first read current Ir1. Consequently, the first sensing circuit 312 issues the output signal OUT in a first logic level state "1". The first logic level state "1" of the output signal OUT indicates that the floating gate transistors Mf1 and Mf3 are in the first storage state. Moreover, the reference current of the second sensing circuit 314 is higher than the second read current Ir2. Consequently, the second sensing circuit 314 issues the output signal OUT' in the first logic level state "1". The first logic level state "1" of the output signal OUT' indicates that the floating gate transistors Mf2 and Mf4 are in the first storage state. For example, the reference current of the first sensing circuit 312 is 2 µA, and the reference current of the second sensing circuit 314 is 2 µA.

Please refer to FIG. 4B. Due to the manufacturing variation of the semiconductor manufacturing process, there is a minute difference between the floating gate transistor Mf1 of the first program path and the floating gate transistor Mf2 of the second program path. Because of this difference, a greater portion of electrons are injected into one of the two floating gate transistors Mf1 and Mf2 during the enrolling operation.

Please refer to FIG. 4B again. During the enrolling operation, the first program current Ip1 flowing through the first program path is higher than a second program current Ip2 flowing through the second program path. In other words, a greater portion of electrons are injected into the floating gate transistor Mf1.

Then, the electrons start to be stored into the shared floating gate of the floating gate transistors Mf1 and Mf3. As the amount of the stored electrons gradually increase, the magnitude of the first read current Ir1 generated by the floating gate transistor Mf3 of the first read path gradually increases. Moreover, the amount of electrons stored in the shared floating gate of the floating gate transistors Mf2 and Mf4 is very small. Consequently, the rise speed of the second read current Ir2 generated by the floating gate transistor Mf4 of the second read path is slower than the rise speed of the first read current Ir1.

The magnitude of the first read current Ir1 and the magnitude of the second read current Ir2 gradually increase. However, the magnitude of the first read current Ir1 and the magnitude of the second read current Ir2 are still lower than the reference current of the first sensing circuit 312 and the reference current of the second sensing circuit 314, respectively. Consequently, the output signal OUT from the first sensing circuit 312 and the output signal OUT' from the second sensing circuit 314 are still in the first logic level state "1".

Please refer to FIG. 4C. After a specified amount of electrons are injected into the shared floating gate of the floating gate transistors Mf1 and Mf3, the magnitude of the first read current Ir1 in the first read path is higher than the reference current of the first sensing circuit 312. Consequently, the first sensing circuit 312 issues the output signal OUT in a second logic level state "0". The second logic level state "0" of the output signal OUT indicates that the floating gate transistors Mf1 and Mf3 are changed to the second storage state.

Moreover, the output signal OUT in the second logic level state "0" is transmitted from the first sensing circuit 312 to the second write buffer 304. Consequently, the second write buffer 304 is disabled, and the bit line BLw' is in a floating state. Meanwhile, the second program path stops performing the program operation, and the electrons are no longer injected into the floating gate of the floating gate transistor Mf2. Consequently, the floating gate transistors Mf2 and Mf4 are maintained in the first storage state. At the same time, the output signal OUT' from the second sensing circuit 314 is maintained in the first logic level state "1". Consequently, the electrons are continuously injected into the floating gate transistor Mf1 of the first program path.

In case that the output signal OUT from the first sensing circuit 312 and the output signal OUT' from the second sensing circuit 314 are different, a single program path of the PUF memory cell c1 continuously performs the program operation and the other program path is disabled. After the enrolling operation is completed, the floating gate transistors Mf1 and Mf3 are changed to the second storage state and the floating gate transistors Mf2 and Mf4 are maintained in the first storage state.

In another situation of the enrolling operation, the second program current Ip2 flowing through the second program path is higher than the first program current Ip1 flowing through the first program path. Consequently, a greater portion of electrons are injected into the floating gate of the floating gate transistor Mf2. After the enrolling operation is completed, the floating gate transistors Mf2 and Mf4 are changed to the second storage state and the floating gate transistors Mf1 and Mf3 are maintained in the first storage state. The operating principles are similar to those mentioned above.

Due to the manufacturing variation of the semiconductor manufacturing process, it is unable to predict which floating gate transistor of the PUF memory cell c1 has the greater amount of injected electrons during the enrolling operation of the random code generator 300. Consequently, the random code generator 300 can generate the random code according to the PUF technology.

After the enrolling operation is completed, the random code generator 300 performs the read operation again and acquires the random code. In accordance with the present invention, the random code generator 300 performs the read operation through the first read path or the second read path in order to generate the random code.

Figure 5:
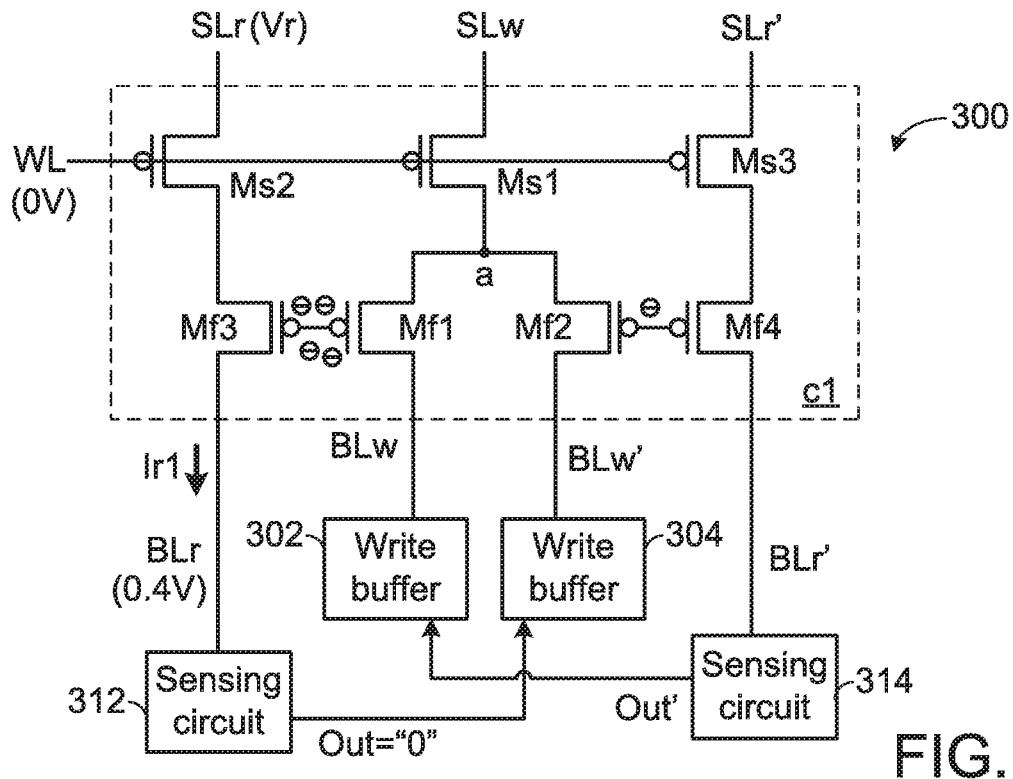
FIG. 5 is a schematic circuit diagram illustrating the process of generating the random code by the random code generator according to the first embodiment of the present invention.

Hereinafter, the uses of the first read path and the first sensing circuit 312 for performing the read operation will be described. FIG. 5 is a schematic circuit diagram illustrating the process of generating the random code by the random code generator according to the first embodiment of the present invention. After the enrolling operation of the random code generator 300 is completed, the read operation is performed. For performing the read operation, the ground voltage (0V) is provided to the word line WL, the read voltage Vr is provided to the source line SLr, and the first voltage (e.g., 0.4V) is provided from the first sensing circuit 312 to the bit line BLr. Since the first program path, the second program path and the second read path are disabled, the first write buffer 302, the second write buffer 304 and the second sensing circuit 314 maintain standby, the bit lines BLw, BLw', BLr' is thus kept floating.

Please refer to FIG. 5 again. For example, electrons are stored in the shared floating gate of the floating gate transistors Mf1 and Mf3, and the magnitude of the first read current Ir1 in the first read path is higher than the reference current of the first sensing circuit 312. Consequently, the first sensing circuit 312 issues the output signal OUT in the second logic level state "0", which is used as one bit of the random code.

In case that no electrons are stored in the shared floating gate of the floating gate transistors Mf1 and Mf3, the magnitude of the first read current Ir1 in the first read path is lower than the reference current of the first sensing circuit 312. Consequently, the first sensing circuit 312 issues the output signal OUT in the first logic level state "1", which is used as one bit of the random code.

Especially, the word line WL can be connected with plural PUF memory cells (e.g., 8 PUF memory cells). After a row of PUF memory cells connected with the word line WL undergo the enrolling operation and the read operation sequentially, 8 bits of one byte are generated.

It is noted that the flowchart of performing the enrolling operation as shown in FIG. 3B may be modified. For example, if the output signal OUT and the output signal OUT' are identical during the enrolling operation, the random code generator 300 provides the program voltage Vpp to the source line SLw. If the output signal OUT and the output signal OUT' are different, the program voltage Vpp may be optionally increased (e.g., from 7.25V to 7.5V) when the single program path of the random code generator 300 is used to perform the program operation in the step S324. Consequently, the program efficiency of the single program path is enhanced, and more electrons are injected into the floating gate transistor of the single program path.

After the enrolling operation of the random code generator 300 is completed, the storage states of the floating gate transistors Mf1, Mf2, Mf3 and Mf4 of the PUF memory cell c1 are set and unchanged. Under this circumstance, a problem occurs. For example, people with bad intentions may use electrons beam inspection instruments to scan the PUF memory cell c1 and deduce the storage states of the floating gate transistors and the random code. Since the random code of the random code generator 300 is possibly cracked, the data in the semiconductor chip may be stolen.

Figure 6:
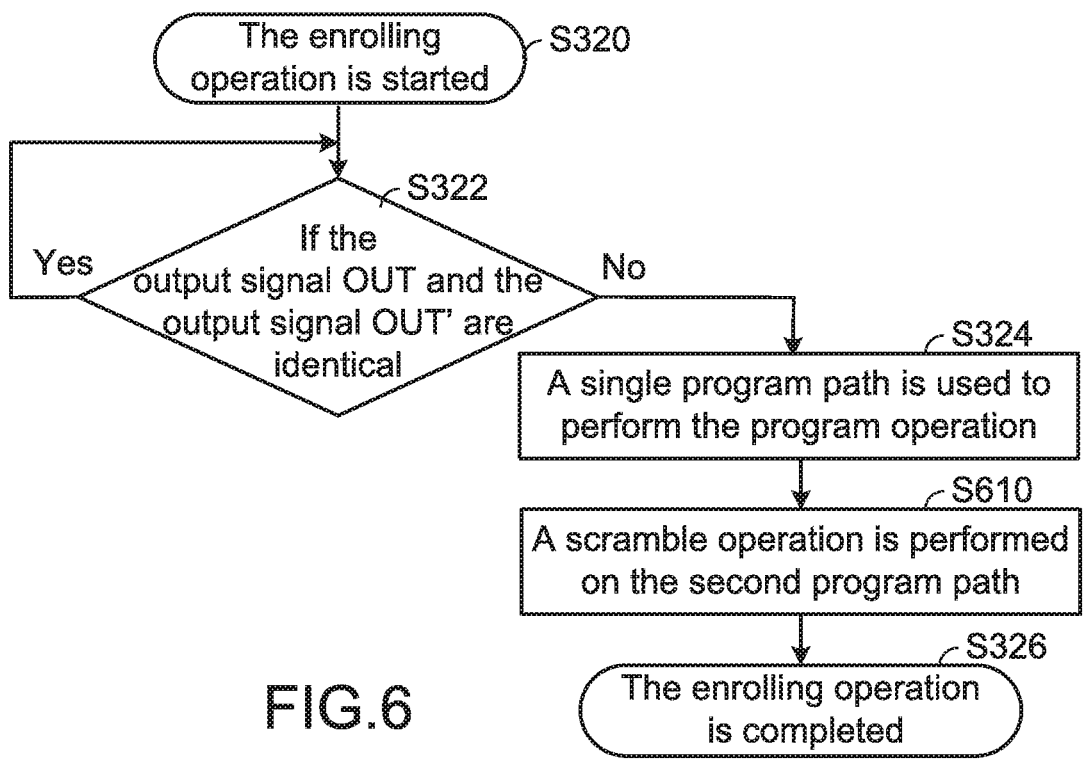
FIG. 6 is a flowchart illustrating another exemplary method of performing the enrolling operation of the random code generator according to the first embodiment of the present invention.

FIG. 6 is a flowchart illustrating another exemplary method of performing the enrolling operation of the random code generator according to the first embodiment of the present invention. In comparison with the flowchart of FIG. 3B, the flowchart of this embodiment further comprises a step of performing a scramble operation on the second program path (Step S610).

The random code generator 300 uses the first read path and the first sensing circuit 312 to perform the read operation and generate the random code. That is, even if the storage state of the floating gate transistors Mf2 and Mf4 of the second read path and the second program path are changed arbitrarily, the content of the random code is not influenced. Consequently, the second program path of the random code generator 300 may undergo the scramble operation. For example, the scramble operation is a random program operation.

For example, the random code generator 300 contains 8 PUF memory cells. The second program paths of the 8 PUF memory cells of the random code generator 300 undergo the random program operation. That is, the storage states of the floating gate transistors Mf2 in the second program paths are changed randomly. Consequently, it is difficult to deduce the content of the random code by using the electrons beam inspection instrument to scan the PUF memory cell c1. In such way, the efficiency of protecting the data of the semiconductor chip from being stolen is enhanced.

On the other hand, in case that the random code generator 300 uses the second read path and the second sensing circuit 314 to perform the read operation and generate the random code, the first program path of the random code generator 300 may undergo the scramble operation.

Figure 7:
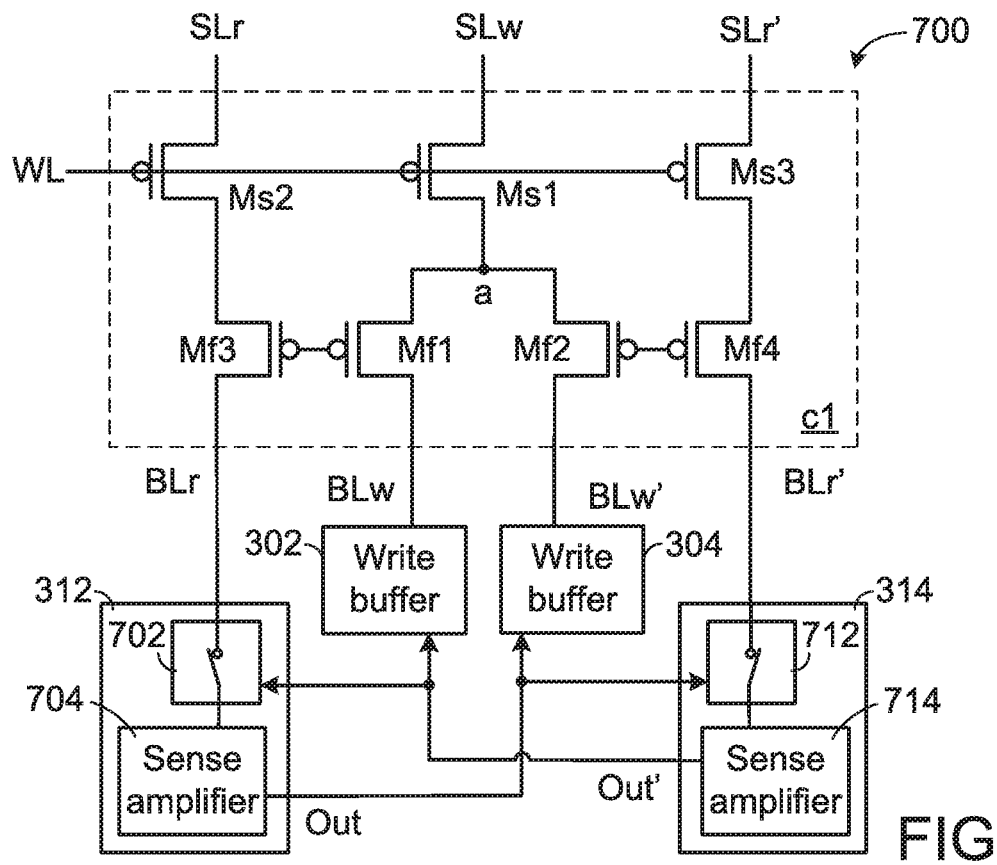
FIG. 7 is a schematic circuit diagram illustrating a random code generator according to a second embodiment of the present invention.

FIG. 7 is a schematic circuit diagram illustrating a random code generator according to a second embodiment of the present invention. As shown in FIG. 7, the random code generator 700 comprises a PUF memory cell c1, a first write buffer 302, a second write buffer 304, a first sensing circuit 312 and a second sensing circuit 314. In comparison with the first embodiment, the first sensing circuit 312 and the second sensing circuit 314 of the random code generator 700 of this embodiment are distinguished. Hereinafter, only the differences between the two embodiments will be described.

In this embodiment, the first sensing circuit 312 comprises a first switch 702 and a first sense amplifier 704. A first terminal of the first switch 702 is connected with the bit line BLr. A second terminal of the first switch 702 is connected with the first sense amplifier 704. A control terminal of the first switch 702 receives the output signal OUT'. The second sensing circuit 314 comprises a second switch 712 and a second sense amplifier 714. A first terminal of the second switch 712 is connected with the bit line BLr'. A second terminal of the second switch 712 is connected with the second sense amplifier 714. A control terminal of the second switch 712 receives the output signal OUT. For example, the first switch 702 and the second switch 712 are transmission gates.

During the enrolling operation of the random code generator 700, the first switch 702 and the second switch 712 are in the close state. Moreover, the first sense amplifier 704 and the second sense amplifier 714 receive the first read current Ir1 and the second read current Ir2 and generates the output signal OUT and the output signal OUT', respectively.

Moreover, when the logic level state of one of the output signal OUT and the output signal OUT' is changed, the corresponding switch is changed to the open state. For example, if the output signal OUT from the first sense amplifier 704 is changed from the first logic level state "1" to the second logic level state "0", the second write buffer 304 is disabled and the second switch 712 of the second sensing circuit 314 is in the open state. Consequently, the second program path is disabled. Meanwhile, the second read path does not generate the second read current Ir2. Consequently, the power consumption of the random code generator 700 is reduced.

Similarly, if the output signal OUT' from the second sense amplifier 714 is changed from the first logic level state "1" to the second logic level state "0", the first write buffer 302 is disabled and the first switch 702 of the first sensing circuit 312 is in the open state. Consequently, the first program path is disabled.

Figure 8:
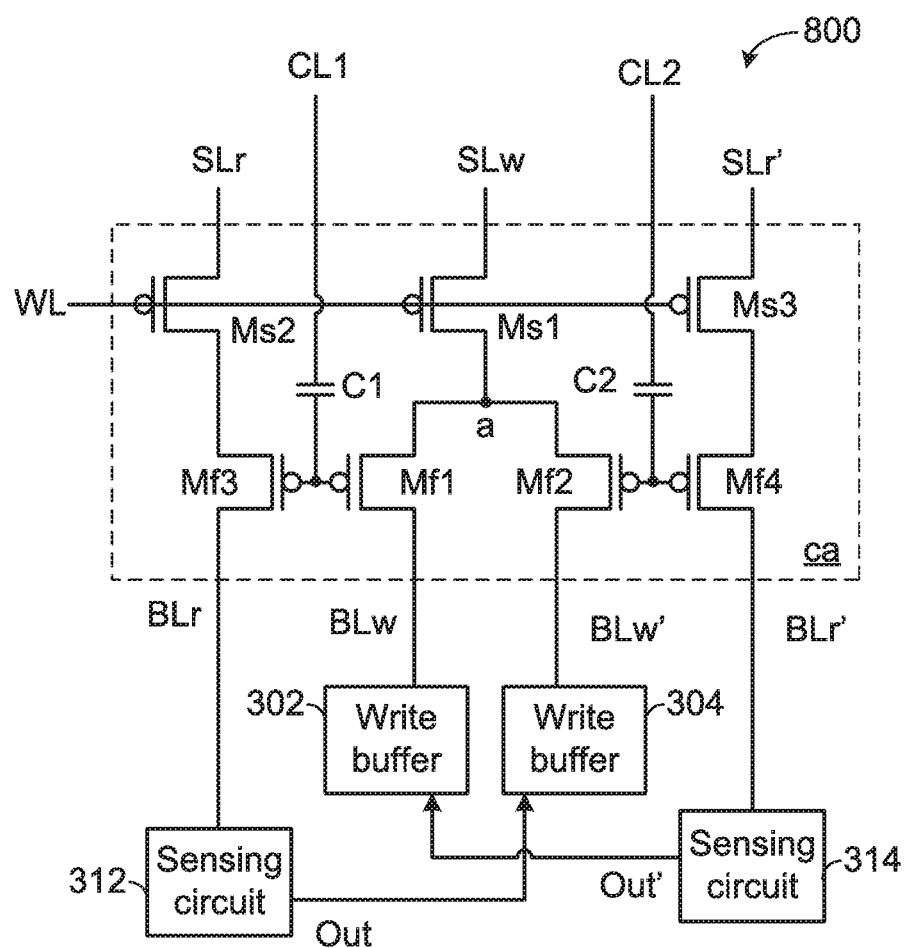
FIG. 8 is a schematic circuit diagram illustrating a random code generator according to a third embodiment of the present invention.

FIG. 8 is a schematic circuit diagram illustrating a random code generator according to a third embodiment of the present invention. As shown in FIG. 8, the random code generator 800 comprises a PUF memory cell ca, a first write buffer 302, a second write buffer 304, a first sensing circuit 312 and a second sensing circuit 314. In comparison with the first embodiment, the structure of the PUF memory cell ca is distinguished. The PUF memory cell ca further comprises a first control path and a second control path. Hereinafter, only the differences between the two embodiments will be described.

The PUF memory cell ca further comprises a first capacitor C1 and a second capacitor C2. A first terminal of the first capacitor C1 is connected with the shared floating gate of the floating gate transistors Mf1 and Mf3. A second terminal of the first capacitor C1 is connected with a first control line CL1. Consequently, a first control path is defined by the first capacitor C1 and the first control line CL1 collaboratively. A first terminal of the second capacitor C2 is connected with the shared floating gate of the floating gate transistors Mf2 and Mf4. A second terminal of the second capacitor C2 is connected with a second control line CL2. Consequently, a second control path is defined by the second capacitor C2 and the second control line CL2 collaboratively.

When an erase voltage Vee is applied to the first control line CL1 and the second control line CL2, the two control paths of the PUF memory cell ca can be used as erase paths. Moreover, electrons can be ejected from the floating gate transistors Mf1-Mf4 through the erase paths. Under this circumstance, the PUF memory cell ca is a MTP memory cell. Moreover, a first erase path is connected between the shared floating gate of the floating gate transistors Mf1 and Mf3 and the first control line CL1, and a second erase path is connected between the shared floating gate of the floating gate transistors Mf2 and Mf4 and the second control line CL2. For example, the erase voltage Vee is 12.0V.

In this embodiment, the random code generator 800 is capable of performing the erase operation. Consequently, the electrons stored in the floating gate transistors Mf1 and Mf3 are ejected from the PUF memory cell ca throughout the first erase path, and the electrons stored in the floating gate transistors Mf2 and Mf4 are ejected from the PUF memory cell ca throughout the second erase path.

In this embodiment, the PUF memory cell ca of the random code generator 800 is the MTP memory cell. Consequently, during the enrolling operation of the random code generator 800, the scramble operation of the second program path contains the erase operation.

For example, in a situation, the random code generator 800 uses the first read path and the first sensing circuit 312 to perform the read operation and generate the random code. The second program path of the random code generator 800 may undergo the scramble operation. For example, the scramble operation includes an erase operation and a random program operation.

For example, the random code generator 800 contains 8 PUF memory cells. Firstly, the second program paths of the 8 PUF memory cells of the random code generator 800 undergo the erase operation. Consequently, the storage state of the floating gate transistors in the second program paths are restored to the first storage states. Then, the second program paths of the 8 PUF memory cells of the random code generator 800 undergo the random program operation. After the random program operation is completed, it is difficult to deduce the content of the random code by using the electrons beam inspection instrument to scan the PUF memory cell. In such way, the efficiency of protecting the data of the semiconductor chip from being stolen is enhanced.

In another situation, the random code generator 800 uses the second read path and the second sensing circuit 314 to perform the read operation and generate the random code. Firstly, the first program paths of the 8 PUF memory cells of the random code generator 800 undergo the erase operation. Then, the first program paths of the 8 PUF memory cells of the random code generator 800 undergo the random program operation.

It is to be noted that the structures of the random code generator 300, 400 and 800 can also be adjusted based on external requirements (such as area considerations). For example, the source lines SLr and SLr of the random code generators 300, 700, and 800 are connected by sharing the same well region, thereby achieving the purpose of reducing the area.

From the above descriptions, a random code generator with a floating gate transistor type memory cell is provided. The floating gate transistor type memory cell is used as a PUF memory cell. The PUF memory cell includes two program paths and two read current. After the enrolling operation is completed, the two floating gate transistors in the two program paths have different storage states. Since it is unable to accurately predict the storage states of the two floating gate transistors in the two program paths, the random code generator of the present invention can generate the random code according to the PUF technology.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A random code generator, comprising:
   a memory cell comprising a first program path, a second program path, a first read path and a second read path, wherein the first program path is connected between a first source line and a first bit line, the second program path is connected between the first source line and a second bit line, the first read path is connected between a second source line and a third bit line, and the second read path is connected between a third source line and a fourth bit line;
   a first write buffer connected with the first bit line;
   a second write buffer connected with the second bit line;
   a first sensing circuit connected with the third bit line, wherein the first sensing circuit generates a first output signal to the second write buffer according to a first read current in the first read path; and
   a second sensing circuit connected with the fourth bit line, wherein the second sensing circuit generates a second output signal to the first write buffer according to a second read current in the second read path,
   wherein while an enrolling operation is performed, the first program path and the second program path perform a program operation, and the first read path and the second read path perform a read operation, wherein if the first output signal and the second output signal are different, one of the first program path and the second program path stop performing the program operation.

2. The random code generator as claimed in claim 1, wherein the first program path comprises:
   a first select transistor, wherein a first terminal of the first select transistor is connected with the first source line, a second terminal of the first select transistor is connected with a node, and a control terminal of the first select transistor is connected with a word line; and
   a first floating gate transistor, wherein a first terminal of the first floating gate transistor is connected with the node, and a second terminal of the first floating gate transistor is connected with the first bit line.

3. The random code generator as claimed in claim 1, wherein the second program path comprises:
   the first select transistor; and
   a second floating gate transistor, wherein a first terminal of the second floating gate transistor is connected with the node, and a second terminal of the second floating gate transistor is connected with the second bit line.

4. The random code generator as claimed in claim 3, wherein the first read path comprises:
   a second select transistor, wherein a first terminal of the second select transistor is connected with the second source line, and a control terminal of the second select transistor is connected with the word line; and
   a third floating gate transistor, wherein a first terminal of the third floating gate transistor is connected with a second terminal of the second select transistor, and a second terminal of the third floating gate transistor is connected with the third bit line,
   wherein a floating gate of the first floating gate transistor and a floating gate of the third floating gate transistor are connected with each other.

5. The random code generator as claimed in claim 4, wherein the second read path comprises:
   a third select transistor, wherein a first terminal of the third select transistor is connected with the third source line, and a control terminal of the third select transistor is connected with the word line; and
   a fourth floating gate transistor, wherein a first terminal of the fourth floating gate transistor is connected with a second terminal of the third select transistor, and a second terminal of the fourth floating gate transistor is connected with the fourth bit line,
   wherein a floating gate of the second floating gate transistor and a floating gate of the fourth floating gate transistor are connected with each other.

6. The random code generator as claimed in claim 5, wherein while the enrolling operation is performed, a ground voltage is provided to the world line, a program voltage is provided to the first source line, a read voltage is provided to the second source line and the third source line, the ground voltage is provided to the first bit line and the second bit line, and a first voltage is provided to the third bit line and the fourth bit line, so that the first program path and the second program path perform the program operation, and the first read path and the second read path perform the read operation.

7. The random code generator as claimed in claim 6, wherein the magnitude of the program voltage is higher than the magnitude of the read voltage, the magnitude of the read voltage is higher than the magnitude of the first voltage, and the magnitude of the first voltage is higher than or equal to the ground voltage.

8. The random code generator as claimed in claim 6, wherein if the first read current is lower than a reference current, the first output signal is in a first logic level state, wherein if the first read current is higher than the reference current, the first output signal is in a second logic level state, wherein if the second read current is lower than the reference current, the second output signal is in the first logic level state, wherein if the second read current is higher than the reference current, the second output signal is in the second logic level state.

9. The random code generator as claimed in claim 8, wherein if the first output signal is changed from the first logic level state to the second logic level state and the second output signal is maintained in the first logic level state, the second write buffer receives the first output signal and disables the second program path, and the first write buffer receives the second output signal to enable the first program path, wherein the second program path stops the program operation, and the first program path continuously performs the program operation.

10. The random code generator as claimed in claim 9, wherein while the first program path continuously performs the program operation, the program voltage is increased.

11. The random code generator as claimed in claim 5, wherein the random code generator comprises a first control path and a second control path, wherein the first control path is connected between a first control line and the floating gate of the first floating gate transistor, and the second control path is connected between a second control line and the floating gate of the second floating gate transistor.

12. The random code generator as claimed in claim 11, wherein the first control path comprises a first capacitor between the first control line and the floating gate of the first floating gate transistor, and the second control path comprises a second capacitor between the second control line and the floating gate of the second floating gate transistor.

13. The random code generator as claimed in claim 12, wherein before the enrolling operation is completed, an erase operation and a random program operation are performed on the second program path.

14. The random code generator as claimed in claim 5, wherein the first sensing circuit comprises a first switch and a first sense amplifier, and the second sensing circuit comprises a second switch and a second sense amplifier, wherein a first terminal of the first switch is connected with the third bit line, a second terminal of the first switch is connected with the first sense amplifier, a first terminal of the second switch is connected with the fourth bit line, and a second terminal of the second switch is connected with the second sense amplifier, wherein the first sense amplifier generates the first output signal to the second switch and the second write buffer, and the second sense amplifier generates the second output signal to the first switch and the first write buffer.

15. The random code generator as claimed in claim 14, wherein if the first output signal is changed from the first logic level state to the second logic level state and the second output signal is maintained in the first logic level state, the second write buffer receives the first output signal and disables the second program path, the second switch receive the first output signal and disables the second read path, and the first write buffer receives the second output signal to enable the first program path, wherein the second program path stops the program operation, the second read path stops the read operation, and the first program path continuously performs the program operation.

16. The random code generator as claimed in claim 1, wherein after the enrolling operation is completed, the first read path performs the read operation, and one bit of a random code is generated according to a logic level state of the first output signal.

17. The random code generator as claimed in claim 1, wherein before the enrolling operation is completed, a scramble operation is performed on the second program path.

18. The random code generator as claimed in claim 17, wherein the scramble operation includes a random program operation.

19. The random code generator as claimed in claim 1, wherein the second source line and the third source are connected with each other.

\* \* \* \* \*